United States Patent
Thomason et al.

(10) Patent No.: US 10,211,060 B2
(45) Date of Patent: Feb. 19, 2019

(54) SEMICONDUCTOR DEVICE AND MANUFACTURING METHOD THEREOF

(71) Applicant: SEMICONDUCTOR COMPONENTS INDUSTRIES, LLC, Phoenix, AZ (US)

(72) Inventors: Michael Thomason, Blackfoot, ID (US); Mohammed Tanvir Quddus, Chandler, AZ (US); James Morgan, Chandler, AZ (US); Mihir Mudholkar, Tempe, AZ (US); Scott Donaldson, Pocatello, ID (US); Gordon M. Grivna, Mesa, AZ (US)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 150 days.

(21) Appl. No.: 15/358,361

(22) Filed: Nov. 22, 2016

(65) Prior Publication Data
US 2017/0076949 A1   Mar. 16, 2017

Related U.S. Application Data

(63) Continuation of application No. 14/472,545, filed on Aug. 29, 2014, now Pat. No. 9,552,993.
(Continued)

(51) Int. Cl.
*H01L 21/02* (2006.01)
*H01L 29/872* (2006.01)
(Continued)

(52) U.S. Cl.
CPC .... *H01L 21/28537* (2013.01); *H01L 21/2855* (2013.01); *H01L 21/28518* (2013.01);
(Continued)

(58) Field of Classification Search
CPC ............... H01L 21/28537; H01L 29/66143
See application file for complete search history.

(56) References Cited

U.S. PATENT DOCUMENTS

| 6,184,564 B1 | 2/2001 | Gould |
| 6,621,107 B2 | 9/2003 | Blanchard et al. |
| (Continued) | | |

FOREIGN PATENT DOCUMENTS

| EP | 0111364 B1 | 3/1989 |
| WO | 2010096261 A3 | 11/2010 |

OTHER PUBLICATIONS

Kent Walters, Bob Werner; Micro Notes Series 401; Introduction to Schottky Rectifiers; 2 pages.
(Continued)

*Primary Examiner* — Moazzam Hossain
(74) *Attorney, Agent, or Firm* — Kevin B. Jackson

(57) ABSTRACT

A number of variations may include a method that may include depositing a first layer on a first semiconductor layer in an overlying position with respect to at least one trench structure formed in the first semiconductor epi layer. The first layer may include a first metal and a second metal. A second layer may comprise a material constructed and arranged to scavenge semiconductor material migrating from the first semiconductor layer during annealing may be deposited over the first layer. The first semiconductor layer may be subjected to at least a first annealing act to provide a first structure. At least a portion of the first structure may be stripped to remove any of the first layer not reacted with the semiconductor material to form a Schottky barrier structure during the first annealing act.

20 Claims, 4 Drawing Sheets

Related U.S. Application Data

(60) Provisional application No. 61/945,771, filed on Feb. 27, 2014.

(51) Int. Cl.
| | |
|---|---|
| *H01L 21/285* | (2006.01) |
| *H01L 21/324* | (2006.01) |
| *H01L 21/768* | (2006.01) |
| *H01L 29/40* | (2006.01) |
| *H01L 29/47* | (2006.01) |
| *H01L 29/66* | (2006.01) |
| *H01L 21/3213* | (2006.01) |

(52) U.S. Cl.
CPC ...... *H01L 21/28568* (2013.01); *H01L 21/324* (2013.01); *H01L 21/76883* (2013.01); *H01L 21/76889* (2013.01); *H01L 29/401* (2013.01); *H01L 29/47* (2013.01); *H01L 29/475* (2013.01); *H01L 29/66143* (2013.01); *H01L 29/8725* (2013.01); *H01L 21/32134* (2013.01)

(56) References Cited

U.S. PATENT DOCUMENTS

| | | | |
|---|---|---|---|
| 6,800,897 | B2 | 10/2004 | Baliga |
| 6,846,729 | B2 | 1/2005 | Andoh et al. |
| 7,749,877 | B2 | 7/2010 | Carta et al. |
| 7,786,003 | B1 | 8/2010 | Halliyal et al. |
| 8,044,461 | B2 | 10/2011 | Session |
| 8,143,655 | B2 | 3/2012 | Chiola |
| 8,148,749 | B2 | 4/2012 | Grebs et al. |
| 8,168,466 | B2 | 5/2012 | Quddus et al. |
| 8,664,065 | B2 | 3/2014 | Grivna |
| 2002/0081839 | A1 | 6/2002 | Shimooka et al. |
| 2004/0208214 | A1* | 10/2004 | Kawasaki ............ B82Y 20/00 372/43.01 |
| 2005/0029614 | A1 | 2/2005 | Wu |
| 2007/0212862 | A1 | 9/2007 | Carta et al. |
| 2007/0284628 | A1* | 12/2007 | Kapoor ............ H01L 29/41775 257/270 |
| 2007/0290234 | A1* | 12/2007 | Wu ................ H01L 29/66143 257/212 |
| 2008/0197439 | A1 | 8/2008 | Goerlach et al. |
| 2009/0114948 | A1 | 5/2009 | Ishida |
| 2010/0207205 | A1 | 8/2010 | Grebs et al. |
| 2011/0135942 | A1* | 6/2011 | Yamakoshi ............ C22C 19/03 428/446 |
| 2011/0159675 | A1 | 6/2011 | Carta et al. |
| 2011/0215338 | A1* | 9/2011 | Zhang ................ H01L 29/1608 257/73 |
| 2012/0088342 | A1* | 4/2012 | Ming ................ H01L 21/82380 438/230 |
| 2012/0139015 | A1* | 6/2012 | Yu .................... H01L 21/28518 257/288 |
| 2012/0181697 | A1 | 7/2012 | Lavoie et al. |
| 2013/0065392 | A1 | 3/2013 | Gregoire |
| 2013/0122695 | A1 | 5/2013 | Chao et al. |
| 2013/0234335 | A1 | 9/2013 | Fitz et al. |
| 2013/0240952 | A1 | 9/2013 | Wong et al. |
| 2014/0001489 | A1 | 1/2014 | Yen et al. |
| 2014/0017888 | A1* | 1/2014 | Hsu ..................... H01L 29/665 438/664 |
| 2014/0073130 | A1* | 3/2014 | Hilscher ........... H01L 21/28052 438/655 |
| 2014/0206190 | A1* | 7/2014 | Li .................... H01L 29/401 438/683 |
| 2014/0248761 | A1* | 9/2014 | Park ................. H01L 21/82387 438/586 |
| 2014/0306291 | A1* | 10/2014 | Alptekin ........... H01L 29/41725 257/369 |
| 2014/0346531 | A1* | 11/2014 | Imai .................... H01L 29/872 257/77 |
| 2014/0346608 | A1* | 11/2014 | Kim .................. H01L 21/28518 257/369 |
| 2015/0024581 | A1* | 1/2015 | Imai .................... H01L 29/872 438/571 |
| 2015/0084108 | A1 | 3/2015 | Saha |
| 2015/0194313 | A1* | 7/2015 | Ryo .................... H01L 29/6606 438/478 |

OTHER PUBLICATIONS

Schottky barrier ; http://en.wikipedia.org/wiki/Schottky_barrier ; 4 pages.
Rectifier ; From Wikipedia, the free encyclopedia ; 1 page.
J. Foggiato (WaferMasters, Inc.) ; Optimizing the Formation of Nickel Silicide ; EMRS 2004,Material Science Issues in Advanced CMOS Source-drain Engineering; Dec. 15, 2004.
W. L. Tan (University of Singapore) ; Effect of a Titanium Cap in Reducing Interfacial Oxides in the Formation of Nickel Silicide ; Journal of Applied Physics ; J. Appl. Phys. 91,2901 (2002).

* cited by examiner

SEMICONDUCTOR DEVICE AND MANUFACTURING METHOD THEREOF

CROSS-REFERENCE TO RELATED APPLICATIONS

This application is a continuation application of U.S. patent application Ser. No. 14/472,545 filed on Aug. 29, 2014 and issued as U.S. Pat. Ser. No. 9,552,993 on Jan. 24, 2017, which claims the benefit of U.S. Provisional Application No. 61/945,771, filed Feb. 27, 2014.

BACKGROUND

The present invention relates, in general, to electronics, and more particularly to semiconductors, structures thereof, and method of forming semiconductor devices.

A Schottky device is a type of semiconductor device that exhibits a low forward voltage drop and a very fast switching action. The lower forward voltage drop translates into less energy wasted as heat, which provides improved system efficiency and higher switching speed compared to conventional PN junction diodes. This makes Schottky devices more suitable for applications requiring higher efficiency power management. Such applications include wireless/portable devices, boost converters for LCD/keypad backlighting, charge circuits as well as other small signal applications.

A need exists to provide a method for forming Schottky barrier rectifiers using alloy compositions that produces stable devices with uniform parameters over a broad range of annealing conditions.

BRIEF DESCRIPTION OF THE DRAWINGS

Select examples of variations within the scope of the invention will become more fully understood from the detailed description and the accompanying drawings, wherein.

DETAILED DESCRIPTION OF THE DRAWINGS

The following description of the variations is merely illustrative in nature and is in no way intended to limit the scope of the invention, its application, or uses.

A number of variations may include a method that may include depositing a first layer on a first semiconductor epi layer (epitaxial layer) in an overlying position with respect to at least one trench structure formed in the first semiconductor epi layer. The layer may include a first metal and a second metal. A second layer comprising a material constructed and arranged to scavenge silicon migrating from the first semiconductor epi layer during annealing may be deposited over the first layer. The first semiconductor epi layer may be subjected to at least a first annealing act to provide a first structure. At least a portion of the first structure may be stripped to remove any of the first layer not reacted with silicon to form a silicide during the first annealing act. In a number of variations the second layer may be selected for its ability to scavenge silicon from a silicide during an annealing act. In a number of variations, a titanium layer may be added over a NiPt film in order to significantly reduce silicide bridging. In a number of variations, the titanium is believed to react or act as a scavenger or getter agent for migrating silicon. The use of a titanium layer over the NiPt film may allow for a broader spectrum of annealing conditions to be used and may not require a low temperature anneal that produces a nickel rich silicide Ni2Si with relatively low barrier heights for a given alloy spectrum. Anneals may be applied at higher temperature levels, which may convert the nickel rich film Ni2Si a more stable monosilicide (NiSi). This may be favorable for manufacturer since one given alloy source may be utilized for a broad range of annealing conditions including both furnace anneal and rapid temperature process anneals.

In a number of variations, a large window of annealing conditions for a given NiPt alloy composition and trench-based Schottky rectifiers may be utilized to produce a stable Schottky device with uniform parameters. The key parameters may include reverse bias leakage, reverse bias breakdown, stable barrier heights. The barrier height can also be a key parameter that is used to tune the efficiency of the rectifying diode needed for low leakage applications, such as automotive applications and medium power applications.

Figure 1:
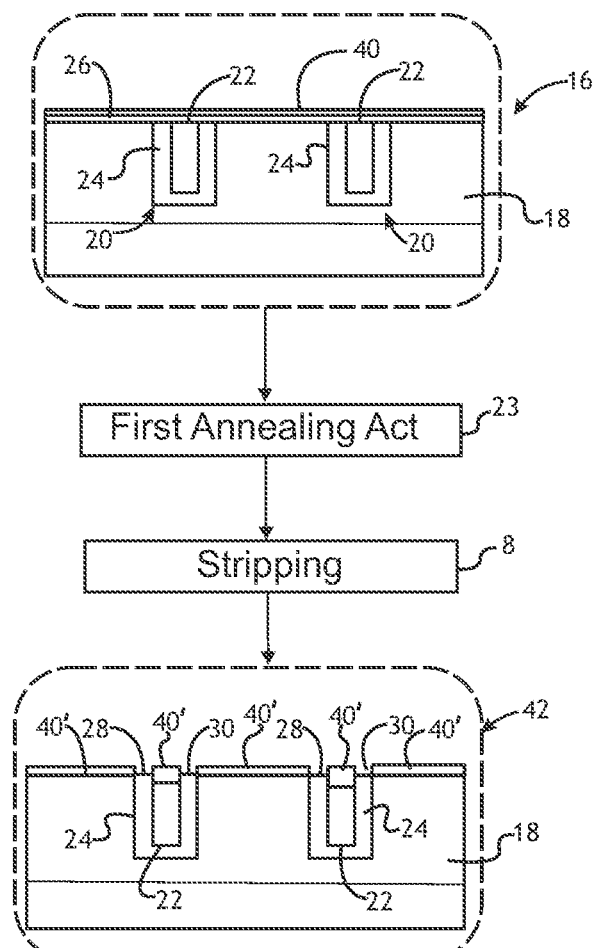
FIG. 1 is a schematic illustration of a method that may include a single annealing act according to a number of variations.

FIG. 1 illustrates a number of variations, which may include a method which may include providing a semiconductor device 16 including a epi layer 18 having a plurality of trench devices 20 formed therein. The trench devices 20 may include a conductive material 22, such as a n-type or p-type material, which may be isolated by an isolation layer 24 along a first wall, an opposite second wall, and a bottom wall. The method may include depositing a first layer 26 on the first semiconductor device 16 and in an overlying position with respect to the trench device 20 formed in the semiconductor epi layer 18, including the isolation layer 24 and the conductive material 22. In a number of variations, the first metal may be NiCr or Titanium, and the second metal may be Chrome or Platinum, but not limited to any particular combination. The weight ratio of the first metal to the second metal may range from 1:99 to 99:1 of any range there between, including but not limited to 5:95 to 5:95, and 85:15 to 60:40. In a number of variations, the thickness of the first layer 26 may range from 100 A to 1500 A, or approximately 700 A. Thereafter, a second layer 40 may be deposited over the first layer 26. In a number of variations the second layer 40 may include a material constructed and arranged to scavenge silicon migrating from the first semiconductor substrate during annealing. In a number of variations, the first metal may be NiCr or Titanium, but not limited to any particular metal or alloy. The alloy combinations for the bottom layer and top layer are not limited to any particular ratio. The method may include subjecting the first semiconductor epi layer 18 to at least a first annealing act 23 to provide a first structure. Thereafter, at least a portion of the first structure may be subject to a stripping act 8 to remove any silicide material formed by the first annealing act 23. In a number of variations the first annealing act 23 may be carried out to achieve a monolayer wherein the first metal and second metal are present in equal atomic amount or weight percent. For example, in a number of variations the first annealing act 23 may be carried out to achieve a mono NiPt layer. In a number of variations, the first annealing act 23 may be carried out at a temperature ranging from 300° C.-700° C. In a number of variations, the first annealing act 23 may be carried out in a furnace for the time period ranging from about 1 min to about 360 minutes. In a number of variations, the first annealing act 23 may be carried out in a rapid temperature process, in a nitrogen atmosphere, for about 15 seconds to about 300 seconds. In a number of variations, the stripping act 8 may comprise exposing at least the portion of the product produced by the first annealing act 23 to a hot sulfuric acid and hydrogen peroxide mixture (SPM). The stripping act 8 may produce a fourth structure 42 including a layer 40' including the first metal, second metal and the material of the second layer with silicon overlying the semiconductor epi layer 18 but with openings 28 and 30 over side walls of an isolation layer 24 isolating a conductive material 22 such as an n-type or p-type material.

Figure 2:
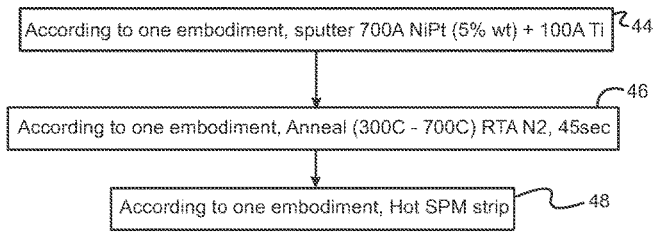
FIG. 2 illustrates a method that may include a second metal layer deposited over a first layer, followed by a single annealing act which may be carried out over a wide temperature range, followed by a stripping act according to a number of variations.

FIG. 2 illustrates a number of variations, which may include a method including sputtering approximately 700 A layer including 95 percent nickel and 5 percent platinum over a subject having trench Schottky structures defined therein, and thereafter sputtering approximately 100 A layer of titanium over the layer including nickel and platinum, as illustrated by box (44). Thereafter, the epi layer may be subjected to an annealing act by exposing the metalized epi layer to a rapid temperature process at a temperature ranging from 300° C.-700° C., for example in a nitrogen atmosphere for approximately 45 seconds, as illustrated by box 46. Thereafter, at least a portion of the first structure may be subject to a stripping act by exposing the first structure to a hot sulfuric acid and hydrogen peroxide (SPM) mixture to remove any nickel, platinum or titanium not reacted with silicon to form silicide during the first annealing act, as illustrated by box 48. However, the method is not limited to using a hot SPM strip. The silicide strip may be an aqua regia mixture or any chemistry that removes unreacted metal alloy.

Figure 3:
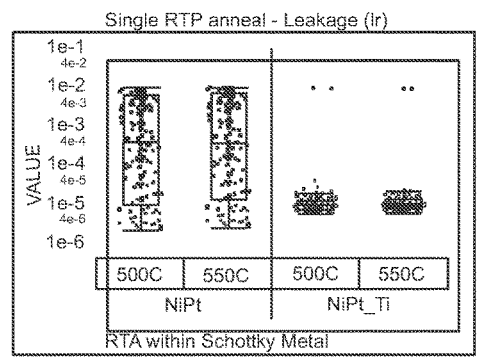
FIG. 3 is a comparative graph of current leakage (A) for trench Schottky devices produced without using a titanium overcoat layer, verses trench Schottky devices produced using a titanium overcoat layer and a single annealing act which may be carried out at different temperatures, according to a number of variations.

FIG. 3 is a comparative graph of current leakage (A) for trench Schottky devices produced without using a titanium overcoat layer, verses trench Schottky devices produced using a titanium overcoat layer and a single annealing act which may be carried out at different temperatures, according to a number of variations.

Figure 4:
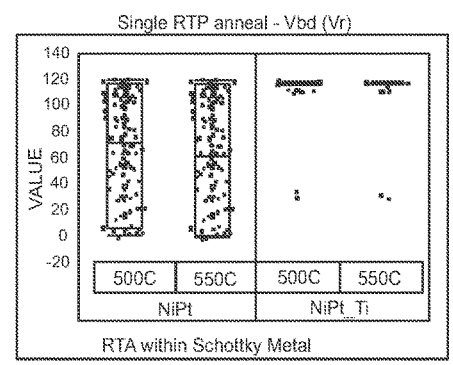
FIG. 4 is a comparative graph showing the breakdown voltage (V) for trench Schottky rectifiers manufactured without a second metal layer compared to trench Schottky rectifiers manufactured using a method including depositing a titanium layer over a first metal layer and using a single annealing act according to a number of variations.

FIG. 4 is a comparative graph showing the breakdown voltage (V) for trench Schottky rectifiers manufactured without a second metal layer compared to trench Schottky rectifiers manufactured using a method including depositing a titanium layer over a first metal layer and using a single annealing act according to a number of variations.

Figure 5:
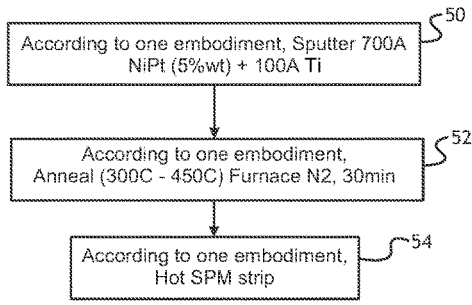
FIG. 5 illustrates a method including depositing a second metal layer over a first metal layer, followed by a low temperature annealing act for a relatively longer time (furnace), followed by a stripping act according to a number of variations.

FIG. 5 illustrates a number of variations, which may include sputtering a first layer on a first epi layer in an overlying position with respect to at least one trench device formed in the first semiconductor epi layer, wherein the first layer comprises 95 weight percent nickel and 5 weight percent platinum and has a thickness of approximately 700 A. Thereafter, sputtering a second layer over the first layer, the second layer comprising titanium and a thickness of approximately 100 A, as illustrated in box 50. Thereafter, subjecting the first semiconductor epi layer to a first annealing act to provide a first structure, wherein the first annealing act comprises exposing the first semiconductor epi layer to a temperature ranging from 300° C.-450° C. in a furnace, in a nitrogen atmosphere, for approximately 30 minutes as illustrated in box 52. Thereafter, stripping at least a portion of the first structure to remove any of the nickel, platinum, and titanium that did not react with silicon to form a silicide during the first annealing act, as illustrated in box 54.

Figure 6:
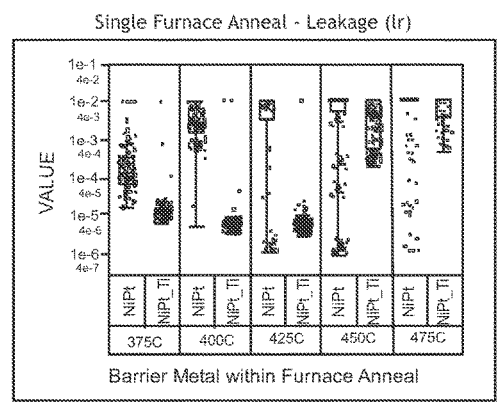
FIG. 6 is a comparative graph illustrating the difference in leakage (A) for trench Schottky devices utilized without a second metal layer compared to trench Schottky devices manufactured using a titanium layer over a nickel and platinum layer, followed by a single low temperature furnace annealing act, which may be carried out at a number of different temperatures, followed by a stripping act, according to a number of different variations.

FIG. 6 is a comparative graph illustrating the difference in leakage (A) for trench Schottky devices utilized without a second metal layer compared to trench Schottky devices manufactured using a titanium layer over a nickel and platinum layer, followed by a single low temperature furnace annealing act, which may be carried out at a number of different temperatures, followed by a stripping act, according to a number of different variations.

Figure 7:
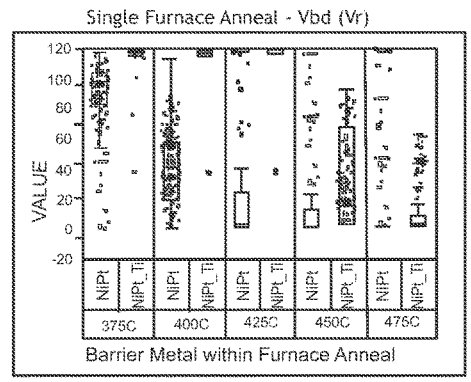
FIG. 7 is a comparative graph showing the breakdown voltage (V) of trench Schottky devices manufactured without the use of a titanium layer compared to trench Schottky devices manufactured using a titanium layer over a nickel/platinum layer, followed by a single low temperature furnace annealing step, followed by stripping which may be carried out at a number of different temperatures according to a number of variations.

FIG. 7 is a comparative graph showing the breakdown voltage (V) of trench Schottky devices manufactured without the use of a titanium layer compared to trench Schottky devices manufactured using a titanium layer over a nickel/platinum layer, followed by a single low temperature furnace annealing step, followed by stripping which may be carried out at a number of different temperatures according to a number of variations.

Figure 8:
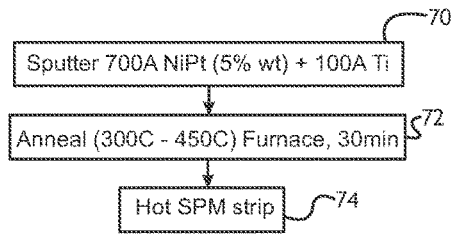
FIG. 8 illustrates a method including depositing a titanium layer over a nickel/platinum layer followed by a low temperature furnace annealing step, followed by a stripping act, according to a number of variations.

FIG. 8 illustrates a number of variations, which may include sputtering a first layer including 95 percent nickel and 5 percent platinum over a first semiconductor epi layer in an overlying position with respect to at least one trench device formed in the first semiconductor epi layer, and wherein the thickness of the nickel and platinum layers approximately 700 A. Thereafter, a second layer including titanium may be deposited over the nickel and platinum layer by sputtering to a thickness of approximately 100 A, as illustrated in box 70. Thereafter, the semiconductor epi layer including the nickel and platinum layer and the titanium layer may be subject to a low temperature annealing act carried out at a temperature ranging from 300° C.-450° C. in a furnace, for approximately 30 minutes, as illustrated in box 72. Thereafter, at least a portion of the annealed epi layer may be subject to a hot SPM stripping act to remove any of the nickel, platinum and titanium that did not react with silicon during the low temperature annealing act, to provide openings over the isolation walls surrounding the trench device, as illustrated in box 74.

Figure 9:
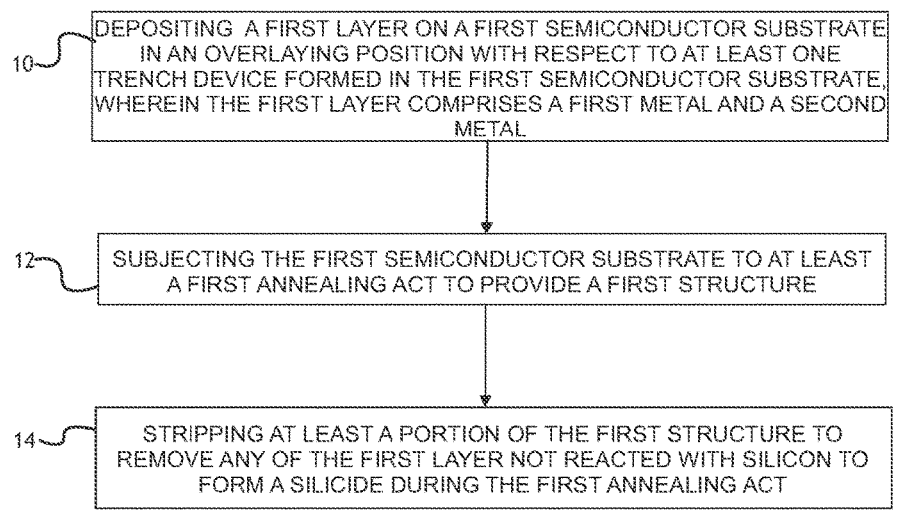
FIG. 9 is a schematic illustration of a method according to a number of variations.

FIG. 9 illustrates a number of variations, which may include an act 10 of depositing a first layer on a first semiconductor epi layer in an overlying position with respect to at least one trench device formed in the first semiconductor epi layer, wherein the first layer comprises a first metal and a second metal, as illustrated by box 10; subjecting a first semiconductor epi layer to at least a first annealing act to provide a first structure, as illustrated by box 12; and stripping at least a portion of the first structure to remove any of the first layer not reacted with silicon to form a silicide during the first annealing act, as illustrated by box 14.

The above described process is a stable process with a large temperature range for annealing. In a number of variations, the barrier height may be adjusted within the large temperature range for annealing if desired. In a number of variations, such a method may be utilized to obtain a full range of metallurgical silicide barrier heights (BH) for a given first metal layer alloy composition, such as for example, but not limited to, in NiPt in trench-based Schottky rectifiers. The barrier height can be a key parameter that is used to tune the efficiency of a rectifying diode needed for low leakage (for example automotive) and may be in power applications. In a number of variations, a higher barrier height may be suitable for applications including, but not limited to, automotive applications to reduce the chance of a thermal runaway during reverse bias, by reducing the leakage current which reduces the temperature rise of a Schottky rectifiers. There can be tradeoff between low VF and low current leakage, as the barrier height increases the leakage current decreases and the forward voltage drop also increases. According to a number of variations, the barrier height may be adjusted using a single alloy composition to meet various market needs for a given family of trench rectifiers.

Barrier height of silicides including two metals can be modulated by annealing conditions. The annealing acts may include furnace or rapid temperature process anneals done in ambient conditions with inert gases. In order to reach higher barrier height spectrums for a given alloy composition, the energy needed (time and temperature) to achieve these conditions can be unfavorable for trench-based Schottky rectifiers. The silicides in these rectifiers can be separated by relatively small distances with nonreactive material (such a silicon dioxide) and with high energy anneals the silicon from the wafer epi layer can migrate creating a NiPtSi or NiSi bridge between adjacent silicides. This can cause device function issues, such as increased diode leakage.

In a number of variations, multiple barrier heights can be achieved with one given alloy source, which allows the designers to fine tune the barrier height for any given rectifier or rectifiers in a family. In a number of variations, the same deposition chamber may be utilized to manufacture rectifiers with different barrier heights.

A number of variations multiple barrier heights may be achieve using a method wherein the depositing a first layer on a semiconductor epi layer comprises placing the first semiconductor epi layer in a first deposition chamber and sputtering a first target having a first weight percent ratio of the first metal and second metal, and wherein the first annealing act exposes the first semiconductor epi layer to a first temperature range for a first time period range so that the first structure has a first barrier height, and further comprising: depositing a second layer on a second semiconductor epi layer in an overlying position with respect to at least one trench device formed in the second semiconductor epi layer, wherein the depositing a second layer on a second semiconductor epi layer comprising placing the second semiconductor epi layer in the first deposition chamber and sputtering the first target having the first weight percent ratio of the first metal and second metal, and wherein the second layer comprises the first metal and the second metal; subjecting the second semiconductor epi layer to at least a second annealing act to provide a second structure, and wherein the second annealing act exposes the second semiconductor epi layer to a second temperature range for a second time period range so that the second structure has a second barrier height different than the first barrier height; stripping at least a portion of the second structure to remove to remove any of the second layer not reacted with silicon to form a silicide during the second annealing act.

The following description of variants is only illustrative of components, elements, acts, product and methods considered to be within the scope of the invention and are not in any way intended to limit such scope by what is specifically disclosed or not expressly set forth. The components, elements, acts, product and methods as described herein may be combined and rearranged other than as expressly described herein and still are considered to be within the scope of the invention.

Variation 1 may include a method that may include depositing a first layer on a first semiconductor epi layer in an overlying position with respect to at least one trench structure formed in the first semiconductor epi layer. The first layer may include a first metal and a second metal. A second layer comprising a material constructed and arranged to scavenge silicon migrating from the first semiconductor epi layer during annealing may be deposited over the first layer. The first semiconductor epi layer may be subjected to at least a first annealing act to provide a first structure. At least a portion of the first structure may be stripped to remove any of the first layer not reacted with silicon to form a silicide during the first annealing act.

Variation 2 may include a method as set forth in Variation 1 wherein the first metal comprises nickel and wherein the second metal comprises platinum.

Variation 3 may include a method as set forth in Variation 2 wherein the nickel is 95 weight percent of the first layer and the platinum is 5 weight percent of the first layer.

Variation 4 may include a method as set forth in Variation 2 wherein the nickel is 85 weight percent of the first layer and the platinum is 15 weight percent of the first layer.

Variation 5 may include a method as set forth in Variation 2 wherein the nickel is 60 weight percent of the first layer and the platinum is 40 weight percent of the first layer.

Variation 6 may include a method as set forth in any of Variations 1-5 wherein the first annealing act comprises exposing the first epi layer to a temperature ranging from 300° C.-700° C.

Variation 7 may include a method as set forth in any of Variations 1-6 wherein the first annealing act is a rapid temperature annealing act exposing the first semiconductor epi layer to a temperature of approximately 400° C. for approximately 45 seconds.

Variation 8 may include a method as set forth in any of Variations 1-7 wherein the second layer comprising titanium.

Variation 9 may include a method as set forth in any of Variations 1-8 wherein the first annealing act is a rapid temperature annealing act carried out in a nitrogen atmosphere furnace for approximately 45 seconds.

Variation 10 may include a method as set forth in any of Variations 1-8 wherein the first annealing act is carried out in a furnace and exposes the first semiconductor epi layer to a temperature ranging from 300° C.-450° C.

Variation 11 may include a method as set forth in any of Variations 1-10 wherein the first annealing act is carried out in a nitrogen atmosphere furnace for approximately 30 minutes.

Variation 12 may include a method as set forth in any of Variations 1-11 wherein the stripping comprises exposing at least a portion of the first structure to a hot sulfuric acid ($H_2SO_4$) and hydrogen peroxide ($H_2O_2$) mixture.

Variation 13 may include a method as set forth in any of Variations 1-12 wherein the stripping comprises exposing at least a portion of the first structure to aqua regia.

Variation 14 may include a method that may include depositing a first layer on a first semiconductor epi layer in an overlying position with respect to at least one trench device formed in the first semiconductor epi layer, wherein the first layer comprises nickel and platinum; depositing a layer comprising a material constructed and arranged scavenge silicon migrating from the first semiconductor epi layer during annealing; subjecting the first semiconductor epi layer to at least a first annealing act to provide a first structure; stripping at least a portion of the first structure to remove any silicide material formed by the first annealing act.

Variation 15 may include a method as set forth in Variation 14 wherein the material constructed and arranged to scavenge silicon migrating from the first semiconductor epi layer during annealing comprises titanium.

Variation 16 may include a method including depositing a first layer on a first semiconductor epi layer in an overlying position with respect to at least one trench structure formed in the first semiconductor epi layer, wherein the first layer comprises a first metal and a second metal; subjecting the first semiconductor epi layer to at least a first annealing act to provide a first structure; stripping at least a portion of the first structure to remove any of the first layer not reacted with silicon to form a silicide during the first annealing act.

Variation 17 may include a method as set forth in Variation 16 wherein the depositing a first layer on a semiconductor epi layer comprises placing the first semiconductor epi layer in a first deposition chamber and sputtering a first target having a first weight percent ratio of the first metal and second metal, and wherein the first annealing act exposes the first semiconductor epi layer to a first temperature range for a first time period range so that the first structure has a first barrier height, and further comprising: depositing a second layer on a second semiconductor epi layer in an overlying position with respect to at least one trench device formed in the second semiconductor epi layer, wherein the depositing a second layer on a second semiconductor epi layer comprising placing the second semiconductor epi layer in the first deposition chamber and sputtering the first target having the first weight percent ratio of the first metal and second metal, and wherein the second layer comprises the first metal and the second metal; subjecting the second semiconductor epi layer to at least a second annealing act to provide a second structure, and wherein the second annealing act exposes the second semiconductor epi layer to a second temperature range for a second time period range so that the second structure has a second barrier height different than the first barrier height; stripping at least a portion of the second structure to remove to remove any of the second layer not reacted with silicon to form a silicide during the second annealing act.

Variation 18 may include a method as set forth in any of Variations 16-17 wherein the first metal comprises nickel and wherein the second metal comprises platinum.

Variation 19 may include a method as set forth in any of Variations 16-18 wherein the nickel is 95 weight percent of the first layer and the platinum is 5 weight percent of the first layer.

Variation 20 may include a method as set forth in any of Variations 16-18 wherein the nickel is 85 weight percent of the first layer and the platinum is 15 weight percent of the first layer.

The above description of select variations within the scope of the invention is merely illustrative in nature and, thus, variations or variants thereof are not to be regarded as a departure from the spirit and scope of the invention.

What is claimed is:

1. A method for manufacturing a semiconductor device comprising:
   providing a first semiconductor layer having a first major surface and at least one trench structure disposed within in the first semiconductor layer extending from the first major surface, wherein the trench structure comprises an isolating layer along a first wall, a bottom surface, and an opposite second wall, and a conductive material disposed between the first wall and the second wall;
   forming a first layer adjacent to the first major surface, wherein the first layer comprises a first metal and a second metal, and wherein the first layer is adjacent to the conductive material and the isolating layer;
   forming a second layer comprising a material constructed and arranged to scavenge semiconductor material migrating from the first semiconductor layer during annealing;
   subjecting the first semiconductor layer to at least a first annealing act whereby the first layer reacts with the first semiconductor layer to form a Schottky barrier structure and reacts with the conductive layer to form a contact structure, and wherein a portion of the first layer remains unreacted after the first annealing act; and
   removing the portion of the first layer that remains unreacted, wherein an opening is thereby formed to expose the isolating layer at the first wall of the trench structure and between the Schottky barrier structure formed adjacent to the first semiconductor layer and the contact structure formed adjacent to the conductive layer.

2. The method of claim 1, wherein:
   providing the first semiconductor layer comprises providing the first the semiconductor layer comprising silicon; and
   the first annealing act provides the Schottky barrier structure comprising a silicide.

3. The method of claim 2, wherein forming the first layer comprises:
   forming the first metal comprising nickel; and
   forming the second metal comprising platinum.

4. The method of claim 3, wherein forming the first layer comprises:
   providing the nickel in a range from about 60 weight percent to about 95 weight percent of the first layer; and
   providing the platinum in a range from about 5 weight percent to about 40 weight percent of the first layer.

5. The method of claim 3, wherein forming the first layer comprises:
   providing the nickel in a range from about 60 weight percent to about 85 weight percent of the first layer; and providing the platinum in a range from about 15 weight percent to about 40 weight percent of the first layer.

6. The method of claim 3, wherein forming the first layer comprises:
providing the nickel in a range from about 85 weight percent to about 95 weight percent of the first layer; and
providing the platinum in a range from about 5 weight percent to about 15 weight percent of the first layer.

7. The method of claim 1, wherein the first annealing act is a rapid temperature annealing act exposing the first semiconductor layer to a temperature in a range from about 300 degrees Celsius through about 700 degrees Celsius.

8. The method of claim 1, wherein forming the second layer comprises forming the second layer comprising titanium.

9. The method of claim 8, wherein the first annealing act is a rapid temperature annealing act carried out in a nitrogen atmosphere.

10. The method of claim 1, wherein the first annealing act is carried out in a furnace and exposes the first semiconductor layer to a temperature ranging from about 300 degrees Celsius through about 450 degrees Celsius.

11. The method of claim 10, wherein the first annealing act is carried out in a nitrogen atmosphere.

12. A method for forming a Schottky rectifier semiconductor device comprising:
providing a first semiconductor layer having a first major surface and at least one trench structure disposed within the first semiconductor layer extending from the first major surface, wherein the trench structure comprises a trench having a first wall, a bottom surface, and an opposite second wall, an isolating layer disposed along the first wall, the bottom surface, and the opposite second wall, and a conductive layer disposed between the first wall and the second wall;
forming a first layer on the first major surface of the first semiconductor layer in an overlying position with respect to the at least one trench structure, wherein the first layer comprises two or more of nickel, chrome, titanium, and platinum, and wherein the first layer is in an overlying position with respect to the conductive layer and the isolating layer;
forming a second layer comprising a material constructed and arranged to scavenge semiconductor material migrating from the first semiconductor layer during annealing;
subjecting the first semiconductor layer to at least a first annealing act to provide a first structure having a Schottky barrier structure overlying the first semiconductor layer and a contact structure overlying the conductive layer; and
removing at least a portion of the first structure to form an opening between the Schottky barrier structure overlying the first semiconductor layer and the contact structure overlying the conductive layer.

13. The method of claim 12, wherein:
providing the first semiconductor layer comprises providing the first semiconductor layer comprising silicon;
forming the first layer comprises depositing the first layer comprising at least nickel and platinum; and
forming the second layer comprises depositing the second layer comprising titanium.

14. The method of claim 13, wherein forming the first layer comprises:
providing the nickel in a range from about 60 weight percent to about 95 weight percent of the first layer; and
providing the platinum in a range from about 5 weight percent to about 40 weight percent of the first layer.

15. The method of claim 12, wherein subjecting the first semiconductor layer to at least the first annealing act comprises subjecting the first semiconductor layer to a temperature in a range from about 300 degrees Celsius through about 700 degrees Celsius.

16. A method for forming a semiconductor device comprising:
providing a first semiconductor layer having a first major surface and a trench structure disposed within the first semiconductor layer extending from the first the major surface into the first semiconductor layer, wherein the trench structure comprises an isolating layer along a first wall, a bottom surface, and an opposite second wall, and a conductive layer disposed within the trench structure between the first wall and the second wall;
forming a first layer in an overlying position with respect to the first major surface and the trench structure, wherein the first layer comprises a first metal and a second metal, and wherein the first layer overlies the conductive layer and the isolating layer;
forming a second layer adjacent to the first layer comprising a material constructed to scavenge semiconductor material migrating from the first semiconductor layer during annealing;
subjecting the first semiconductor layer to at least a first annealing act whereby the first layer reacts with the first semiconductor layer to form a Schottky barrier structure and the conductive layer to form a conductive structure; and
removing at least a portion of any unreacted portion of the first layer, wherein an opening is thereby formed to expose the isolating layer proximate to the first wall of the trench structure and between the Schottky barrier structure and the conductive structure.

17. The method of claim 16, wherein:
forming the first layer comprising forming the first layer comprising at least nickel and platinum on the first semiconductor layer comprising silicon; and
forming the second layer comprises forming the second layer comprising titanium.

18. The method of claim 17, wherein forming the first layer comprises forming the first layer where the nickel is in a range from about 60 weight percent to about 95 weight percent of the first layer and where the platinum is in a range from about 5 weight percent to about 40 weight percent of the first layer.

19. The method of claim 17, wherein forming the first layer comprises forming the first layer having a thickness in a range from about 100 Angstroms through about 1,500 Angstroms.

20. The method of claim 16, wherein subjecting the first semiconductor layer to at least the first annealing act comprises subjecting the first semiconductor layer to a temperature in a range from about 300 degrees Celsius through about 700 degrees Celsius.

* * * * *